US008159315B2

(12) United States Patent
Tsutsumi et al.

(10) Patent No.: US 8,159,315 B2
(45) Date of Patent: Apr. 17, 2012

(54) SUBSTRATE, COMMUNICATION MODULE, AND COMMUNICATION APPARATUS

(75) Inventors: Jun Tsutsumi, Kawasaki (JP); Kazuhiro Matsumoto, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 284 days.

(21) Appl. No.: 12/372,365

(22) Filed: Feb. 17, 2009

(65) Prior Publication Data

US 2009/0206956 A1 Aug. 20, 2009

(30) Foreign Application Priority Data

Feb. 20, 2008 (JP) ................................ 2008-038927

(51) Int. Cl.
*H03H 7/38* (2006.01)

(52) U.S. Cl. ......................................... 333/238; 333/33

(58) Field of Classification Search .................... 333/33, 333/32, 238, 246
See application file for complete search history.

(56) References Cited

U.S. PATENT DOCUMENTS

| | | | | |
|---|---|---|---|---|
| 6,420,942 | B1 * | 7/2002 | Hiroshima et al. | 333/26 |
| 6,483,402 | B2 | 11/2002 | Endoh et al. | |
| 6,521,972 | B1 | 2/2003 | Zhou et al. | |
| 7,113,058 | B2 * | 9/2006 | Hidaka et al. | 333/202 |
| 7,579,930 | B2 * | 8/2009 | Hosokawa et al. | 333/134 |
| 2001/0022544 | A1 | 9/2001 | Endoh et al. | |
| 2004/0239452 | A1 | 12/2004 | Bassali | |
| 2006/0103482 | A1 | 5/2006 | Hettak | |
| 2006/0132260 | A1 | 6/2006 | Iwamoto et al. | |

FOREIGN PATENT DOCUMENTS

| | | | |
|---|---|---|---|
| EP | 1 096 595 | A2 | 5/2001 |
| EP | 1 137 176 | A2 | 9/2001 |
| EP | 1 675 262 | A2 | 6/2006 |
| JP | 5-327301 | A | 12/1993 |
| JP | 2001-267885 | A | 9/2001 |
| JP | 2002-223077 | A | 8/2002 |
| JP | 2006-180192 | A | 7/2006 |

OTHER PUBLICATIONS

JP05-327301 machine translation.*

D. Guha , et al. "Concentric Ring-Shaped Defected Ground Structures for Microstrip Applications" IEEE Antennas and Wireless Propagation Letters, IEEE, Piscataway, NJ, US, vol. 5, No. 1, Dec. 1, 2006, pp. 402-405.

S. Banba, et al. "Novel MMIC Transmission Lines Using Thin Dielectric Layers," IEICE Transactions on Electronics Society,Tokyo,Japan, vol. E75-C, No. 6, Jun. 1, 1992, pp. 713-720.

A.R. Yaghmour, et al. "Effect of Mutual Coupling Between Signal Traces and Ground Planes on SSO Noise in Packages with Multiple Stacked Ground Planes," IEEE 1997, Electronic Components and Technology Conference, 1997 Proceedings, 47$^{th}$ San Hose, CA , USA May 18-21, 1997, New York, New York, USA, IEEE, US, May 18, 1997 pp. 836-841.

* cited by examiner

*Primary Examiner* — Stephen Jones
(74) *Attorney, Agent, or Firm* — Chen Yoshimura LLP

(57) ABSTRACT

A substrate for mounting a filter has a connection line layer having a transmission line for connecting a filter, a ground layer placed below the connection line layer and having a ground, and an insulation layer placed between the transmission line and the ground layer and having a thickness which satisfies a characteristic impedance of the transmission line in a range 0.1 to 50 ohms, the characteristic impedance determined by the thickness and a dielectric constant of the insulation layer and a width of the transmission line.

31 Claims, 10 Drawing Sheets

SUBSTRATE, COMMUNICATION MODULE, AND COMMUNICATION APPARATUS

CROSS-REFERENCE TO RELATED APPLICATION

This application is based upon and claims the benefit of priority of the prior Japanese Patent Application No. 2008-038927, filed on Feb. 20, 2008, the entire contents of which are incorporated herein by reference.

BACKGROUND OF THE INVENTION

1. Field of the Invention

The present invention relates to a substrate for a high-frequency filter and a multiplexer used for a mobile communication apparatus and wireless device, typically for example, a mobile phone. Further, the present invention relates to a high-frequency filter and a duplexer, and more particularly, to a high-frequency filter and a duplexer using an acoustic-wave device. Furthermore, the present invention relates to a module and a communication apparatus using these.

2. Description of the Related Art

Recently, a multiband/multisystem advances for a wireless communication apparatus, typically for example, a mobile phone. A plurality of communication apparatuses are mounted to one mobile phone. One communication apparatus usually needs a plurality of filters, a duplexer, and a power amplifier. One mobile phone therefore needs to include a numerous number of high-frequency devices, and this becomes a factor for preventing the reduction in size of the mobile phone. Hence, the reduction in size and thickness of the high-frequency devices are greatly demanded.

For a high-frequency filter, a duplexer, and a power amplifier used for the communication apparatus, input/output impedances thereof are adjusted to be 50 ohms. Then, each of them is packaged in a single component and supplied. Acoustic-wave devices such as a surface acoustic wave (SAW) filter and a film bulk acoustic wave resonator (FBAR) filter are widely used for the high-frequency filter and the duplexer. Since the input/output impedance can be adjusted by the design of the filter element for the acoustic-wave devices, 50 ohms can be realized without adding another matching circuit. However, in the case of the power amplifier, the input/output impedance thereof is usually several ohms, and 50 ohms is not accomplished only by the design of the amplifier element. Therefore, matching circuit elements are required, then space therefor is necessary, and this becomes an obstacle for decreasing sizes of the components.

FIG. 18A shows an outline of an RF block of a conventional mobile phone. A high-frequency block shown in FIG. 18A comprises: an antenna 101; a duplexer 102; a low-noise amplifier (LNA) 103; an inter-stage filter 104; an LNA 105; mixers 106 and 109; low-pass filters (LPFs) 107 and 110; variable gain amplifiers (VGAs) 108 and 111; a phase control circuit 112; a transmitter 113; a inter-stage filter 114; and a power amplifier (PA) 115. FIG. 18A illustrates an RF block for structuring one communication apparatus. A multiband/multisystem mobile phone comprises a plurality of RF blocks.

Referring to FIG. 18A, the filters 114 between transmitting stages and the duplexer 102 are usually arranged in front of the power amplifier 115 and on the back thereof, respectively. Referring to FIG. 18B, the power amplifier 115 is generally provided as a power amplifier module having an amplifier element 115*a* and matching circuits 115*b* and 115*c*, thereby performing the impedance matching of 50 ohms between the filter and the duplexer. Therefore, the size of the power amplifier module is approximately 4×4 mm, and it is larger than a high-frequency filter (e.g., 1.4×1.0 mm). In order to reduce the size of the RF block, the simplification or deletion of a matching circuit connected to the power amplifier 115 is advantageous. Therefore, the input/output adjustable impedances of the high-frequency filter and the duplexer should be designed to be greatly smaller than 50 ohms close to the input/output impedance of the power amplifier.

However, the high-frequency filter and the duplexer are connected to the power amplifier and are also connected to another part of which the input/output impedances are usually 50 ohms. Therefore, the input/output impedances of the high-frequency filter and the duplexer need individually to be two impedances including 50 ohms and the value much smaller than 50 ohms.

Conventionally, the high-frequency filter and the duplexer having two different impedances as the input/output impedances individually have an input impedance of 50 ohms and an input impedance of 100 ohms or 200 ohms larger than 50 ohms with balance/unbalance output conversion. The filter and duplexer are realized so as to omit a balance/unbalance converting circuit existing between a low-noise amplifier and a filter, corresponding to a balanced input for reducing noises (refer to, e.g., Japan Laid-open Patent Publication No. 2001-267885).

Since the power amplifier having the input/output impedance of several ohms is generally provided as a module including a matching circuit. Therefore, the high-frequency filter and the duplexer having both the impedances of 50 ohms and a value smaller than 50 ohms are not available. However, as mentioned above, the matching circuit of the power amplifier is preferably simplified or deleted because of a demand for reducing the size of the high-frequency device. Therefore, the high-frequency filter and the duplexer having the impedance of 50 ohms and the impedance smaller than 50 ohms are needed.

Further, a duplexer 201 used for an RF block of a mobile phone shown in FIG. 19 is expected to be directly connected to a power amplifier 203 having an impedance smaller than 50 ohms and a low-noise amplifier 202 having an impedance larger than 50 ohms. Therefore, in the duplexer 201, a transmitting port 205 needs to have an input impedance smaller than 50 ohms, an antenna port 206 connected to the antenna 101 needs to have an impedance of 50 ohms, and a receiving port 204 connected to the low-noise amplifier 202 needs to have an impedance larger than 50 ohms. That is, the duplexer 201 needs to have three different impedances.

Summarily, the high-frequency filter and the duplexer individually need to have two types of impedances including the impedance smaller than 50 ohms and the impedance of 50 ohms (e.g., the inter-stage filters 114 between the transmitting stages shown in FIG. 18A), three types of the impedance smaller than 50 ohms, the impedance of 50 ohms, and the impedance larger than 50 ohms (the duplexer 201 shown in FIG. 19), or two types of impedances including the impedance of 50 ohms and the impedance larger than 50 ohms (e.g., the inter-stage filter 104 shown in FIG. 18A).

In order to manufacture the high-frequency filter and the duplexer which satisfies the specification above, the input/output impedances of filter elements including the SAW and the FBAR filters need to have each of impedance values smaller and larger than 50 ohms. Further a characteristic impedance of a transmission line disposed on a substrate on which the filter elements are disposed also need to have each of impedance values smaller and larger than 50 ohms. Since the input impedances of the SAW filter and the FBAR filter can be easily adjusted, the SAW filter and the FBAR filter have no problems.

SUMMARY

However, a usual design method may be not applied for design of a transmission line having different characteristic impedances such as values smaller and larger than 50 ohms without increasing cost and a size of substrate or a chip on or in which the line is included. It is because that several parameters of a conventional substrate are limited to realize the transmission line having different impedances. Further, in terms of costs of the high-frequency filter and the duplexer currently demanded, preferably, a layer structure in the substrate is unified for a plurality of part including the inter-stage filters 114, the inter-stage filter 104, and the duplexer 102 in FIG. 18A. Accordingly, with the structure of one layer, such a substrate is demanded that the characteristic impedance can be easily adjusted and the layer structure enables the increase in degree of freedom for design.

It is one object of the present invention to stably provide a high-frequency filter and a duplexer having an impedance less than 50 ohms and an impedance not less than 50 ohms with small size and small costs. Further, it is another object of the present invention to realize a communication module having the substrate, the filter, or the duplexer. Furthermore, it is another object of the present invention to realize a communication apparatus having the communication module.

A first substrate according to the present invention comprises: a filter connection line layer having a transmission line for connecting the filter element; a ground layer that is arranged below the filter connection line layer and has a ground portion at least on a part thereof; and an insulation layer that is arranged between the filter connection line layer and the ground layer. The insulation layer is formed with a characteristic impedance determined depending on a connection line width of the filter connection line layer and a dielectric constant and a thickness of the insulation layer, ranging 0.1 to 50 ohms.

A second substrate according to the present invention comprises: a filter connection line layer having a transmission lines for connecting the filter element; a ground line layer that is arranged below the filter connection line layer and has a ground portion at least on one part thereof; and an insulation layer that is arranged between the filter connection line layer and the ground layer. A thickness of the insulation layer is formed to be not more than the half of a thickness having a characteristic impedance determined depending on a metallic width of the filter connection line layer and a dielectric constant and a thickness of the insulation layer, ranging 0.1 to 50 ohms.

DESCRIPTION OF THE PREFERRED EMBODIMENTS

[1. Structure of Substrate, Filter, and Duplexer]

Figure 1:
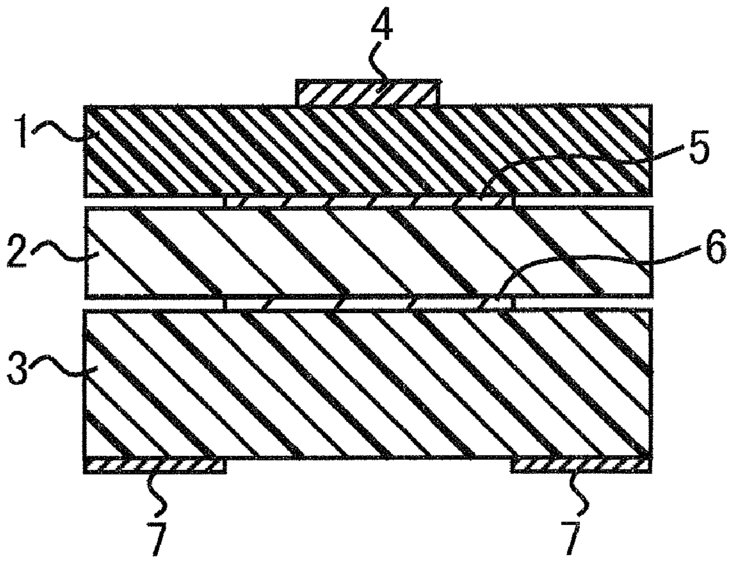
FIG. 1 illustrates a sectional view of a substrate according to an embodiment.

FIG. 1 is a cross-sectional view showing a layer structure of a substrate according to embodiments. Referring to FIG. 1, the substrate includes a first insulation layer 1, a second insulation layer 2, and a third insulation layer 3. Further, a first metal layer 4 is formed onto the surface of the first insulation layer 1. Furthermore, a second metal layer 5 is formed between the first insulation layer 1 and the second insulation layer 2. In addition, a third metal layer 6 is formed between the second insulation layer 2 and the third insulation layer 3 and a fourth metal layer 7 is formed to the lower surface of the third insulation layer 3. The first metal layer 4 is used as a transmission line such as a microstripline.

The first metal layer 4 is an example of a filter connection line layer for connecting the filter element according to the embodiment. Further, the second metal layer 5, the third metal layer 6, and the fourth metal layer 7 can have a ground pattern (ground portion) at least on one part thereof, and are examples of a ground layer according to the present embodiment.

Figure 2:
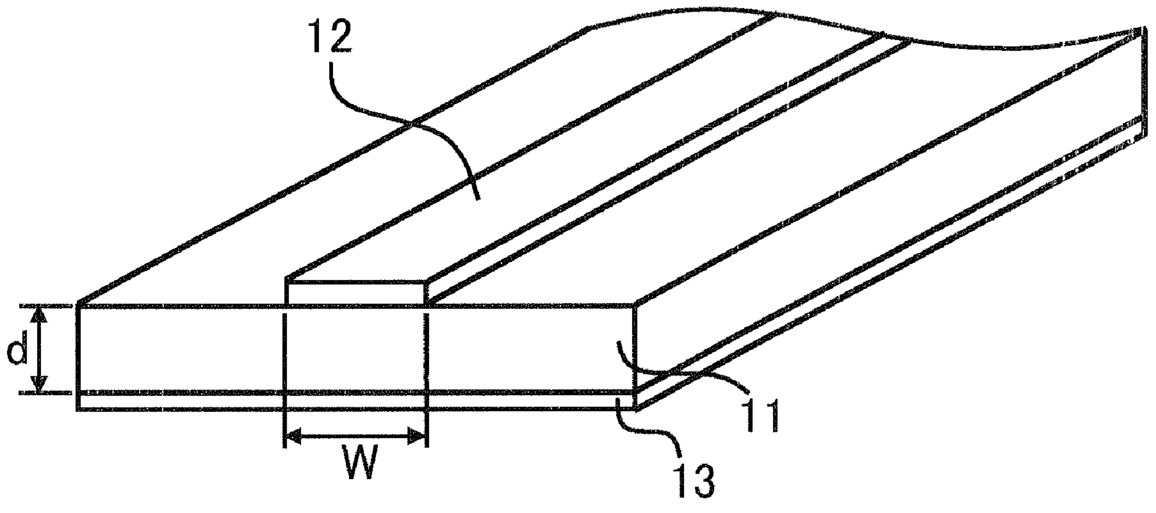
FIG. 2 illustrates a perspective view of a structure of microstrip line disposed on a substrate.

It is described below on a characteristic impedance of a microstripline as a transmission line, where the microstripline is formed on a surface of a substrate. FIG. 2 illustrates the structure of the microstripline. A metal pattern 12 of the microstripline is formed to the surface of an insulator 11, and a ground layer 13 is formed on the back side of the insulation layer 11.

A characteristic impedance of the microstripline is approximately determined depending on a dielectric constant and a thickness d of the insulator 11 and a width W of the metallic pattern 12. The dielectric constant of the insulator 11 is determined depending on an insulator material, and therefore factors to design are the thickness d of the insulator 11 and the width W of the metal pattern 12.

Herein, an adjusting method of the characteristic impedance will be described. In order to reduce the characteristic impedance, the thickness d of the insulator 11 needs to be made thinner or the width W of the metal pattern 12 needs to be increased. On the contrary, the increase in characteristic impedance needs to make the thickness d of the insulator 11 thicker or the width W of the metal pattern 12 smaller. Based on these relationships among a characteristic impedance, the thickness of the insulator 11, and the width of the metal pattern 12, it is explained that the substrate having the layer structure can be easily stably manufactured with costs, while the characteristic impedance is adjustable one of the range of value smaller than 50 ohms to a value larger than 50 ohms in spite of a smaller and thinner size.

Referring back to FIG. 1, in the substrate according to the embodiment, the first metal layer 4 is used for connecting the filter element, and is formed to the surface of the substrate. Further, the second metal layer 5 is below the first metal layer 4 and is formed by one layer below a filter mounting surface. Furthermore, the ground pattern is arranged at least to one part of the second metal layer 5, thereby forming the microstripline.

As mentioned above, the characteristic impedance of the microstripline is determined depending on: the width of the metallic pattern of the first metal layer 4; the dielectric constant and thickness of the first insulation layer 1 which sandwiched by the first metal layer 4 and the second metal layer 5. Therefore, according to the embodiment, the thickness of the first insulation layer 1 is made thinner so that the characteristic impedance is smaller than 50 ohms and the substrate includes an insulation layer that has almost equal or larger the thickness of the first insulation layer 1.

Since the substrate has the structure above, the microsprip-line of the characteristic impedance smaller than 50 ohms can be fabricated with a metallic pattern formed to the first metal layer 4 and a ground pattern formed to the second metal layer 5. Thereby, the substrate can be manufactured without increasing the width of the metallic pattern. The lower limit value of the characteristic impedance can be a manufacturing limit value of the substrate, e.g., 0.1 ohms. Further, in the case of the characteristic impedance of 50 ohms or more, the width of the metallic pattern of the first metal layer 4 is smaller. It is also effective for the increased characteristic impedance that a ground pattern is formed to the metal layer (the third metal layer 6 or the fourth metal layer 7) below the second metal layer 5. The structure realizes the substrate of a desired characteristic impedance without preventing the reduction in size.

The first insulation layer 1 is made thinner, and the entire strength of the substrate can be thus weak. However, the thickness of another insulation layer (the second insulation layer 2 or the third insulation layer 3) is made thicker than the thickness of the first insulation layer 1, thereby ensuring the strength and stably supplying the substrate.

It is also preferable to configure the substrate as following. Assuming that: reference numeral W denotes a width of the metallic pattern of the first metal layer 4 forming the microstripline; and reference numeral $e_r$ denotes a dielectric constant of the first insulation layer 1 sandwiched by the first metal layer 4 and the second metal layer 5. The thickness d of the first insulation layer 1 can be determined as satisfying the following relation.

$$d \leqq (0.0952\times W+0.6)\times e_r+(0.1168\times W+1.32) \quad \text{(Expression 1)}$$

Further, the substrate may include an insulation layer that substantially matches the thickness d of the first insulation layer 1 or is thicker than it.

As mentioned above, the thickness d of the first insulation layer 1 is determined as satisfying the expression 1, and the metallic and the ground patterns are arranged so as to sandwich the first insulation layer 1, as will be described later, thereby easily forming the transmission line having the characteristic impedance smaller than 50 ohms without preventing the reduction in size. Further, the characteristic impedance not less than 50 ohms is realized by making the width W of the metallic pattern of the first metal layer 4 thinner or by forming the ground pattern to a metal layer below the second metal layer 5. The first insulation layer 1 is made thinner and the entire strength of the substrate can be thus weak. However, another insulation layer (the second insulation layer 2 or the third insulation layer 3) is formed to be thicker than the first insulation layer 1, thereby ensuring the strength. Thus the substrate can be stably manufactured and supplied.

Another way is shown below, thereby the substrate serves to form the microstripline having a characteristic impedance of smaller than or equal to 50 ohms. The thickness of the insulation layer 1 is designed smaller than or equal to the half of the providing 50 ohms of characteristic impedance which is determined with relative dielectric constant $e_r$ of the first insulation layer 1 and the width W of metallic pattern 4 constituting the microstripline. In addition the substrate includes an insulation layer having a thickness approximately equal to or thicker than the thickness d of the first insulation layer 1.

With the above-mentioned structure, in the case of the characteristic impedance smaller than 50 ohms, the metallic pattern is formed to the first metal layer 4 and the ground pattern is arranged to the second metal layer 5. Thereby the substrate can be easily manufactured. On the other hand, to achieve the microstripline of the characteristic impedance of 50 ohms, the width of the metallic pattern formed to the first metal layer 4 is formed smaller. Or the ground pattern is disposed on the third insulation layer 3 so that both of the first insulation layer 1 and the second insulation layer 2 are sandwiched by the first metal layer 4 and the ground pattern. Then the total thickness of the first insulation layer 1 and the second insulation layer 2 is adjusted, thereby accomplishing the characteristic impedance of just 50 ohms. In other words, the characteristic impedance smaller than 50 ohms and the characteristic impedance of 50 ohms can be realized without changing the width W of the metallic pattern. Further in order to realize the characteristic impedance larger than 50 ohms, the width of the metallic pattern of the first metal layer 4 is smaller, or the ground pattern is formed via an insulation layer below the second insulation layer 2, thereby easily realizing the substrate. Furthermore, in the substrate, the first insulation layer 1 is formed to be extremely thinner than that when the first insulation layer 1 realizes the characteristic impedance of 50 ohms. Therefore, the substrate includes an insulation layer with the thickness substantially matching that of the first insulation layer 1 or the thickness larger than it, and the substrate can be stably manufactured or supplied while keeping the entire strength of the substrate.

It is also preferable to configure the substrate as following. Assuming that: reference numeral W denotes a width of the metallic pattern of the first metal layer 4 forming the microstripline; and a reference numeral $e_r$ denotes a dielectric constant of the first insulation layer 1 sandwiched by the first metal layer 4 and the second metal layer 5. The thickness d of the first insulation layer 1 can be determined as satisfying the following relation.

$$d \leqq \{(0.0952\times W+0.6)\times e_r+(0.1168\times W+1.32)\}/2 \quad \text{(Expression 2)}$$

Further, the substrate may include an insulation layer that substantially matches the thickness d of the first insulation layer 1 or is thicker than it.

The thickness d of the first insulation layer 1 is determined according to expression 2 and is consequently equal to or smaller than the half of that of the insulation layer having 50 ohms, which will be described later. Therefore, the metallic pattern and the ground pattern are arranged by sandwiching the first insulation layer 1, thereby easily forming the transmission line having the characteristic impedance extremely smaller than 50 ohms. On the other hand, to achieve the microstripline of the characteristic impedance of 50 ohms, the width of the metallic pattern formed to the first metal layer 4 is formed smaller. Or the ground pattern is disposed on the second insulation layer 2 so that both of the first insulation layer 1 and the second insulation layer 2 are sandwiched by the first metal layer 4 and the ground pattern. Then the total thickness of the first insulation layer 1 and the second insulation layer 2 is adjusted, thereby accomplishing the characteristic impedance of just 50 ohms. In other words, the characteristic impedance smaller than 50 ohms and the characteristic impedance of 50 ohms can be realized without changing the width W of the metallic pattern. Further, in order to realize the characteristic impedance larger than 50 ohms, the width of the metallic pattern of the first metal layer 4 is smaller, or the ground pattern is formed via an insulation layer below the second insulation layer 2, thereby easily realizing the characteristic impedance larger than 50 ohms. Furthermore, in the case of the substrate having a structure described above, the first insulation layer 1 is formed to be extremely thinner than that when the first insulation layer 1 realizes the characteristic impedance of 50 ohms. Therefore, the substrate includes an insulation layer with the thickness substantially matching that of the first insulation layer 1 or the thickness larger than it, and the substrate can be stably manufactured or supplied while keeping the entire strength of the substrate.

The substrate may comprise three or more insulation layers. As a consequence, dielectric thicknesses for realizing three characteristic impedances having a value smaller than 50 ohms, a value of 50 ohms, and a value larger than 50 ohms are individually formed and, preferably, the design with a higher degree of freedom can be accomplished.

A hermetic structure can be realized by using an insulation layer including at least a material composed of ceramics, because the strength of the substrate increased and the hygroscopicity is decreased.

For stable manufacturing of the substrate, it is preferable that the thickness of the insulation layer (the third insulation layer 3 according to the embodiment) as the undermost layer of the substrate is larger than the thickness of the first insulation layer 1. Thereby, the undermost layer can serve as a base substrate with high strength for a laminating process in the manufacturing of the substrate. The substrate can be stably manufactured with low misalignment of layers.

Figure 3:
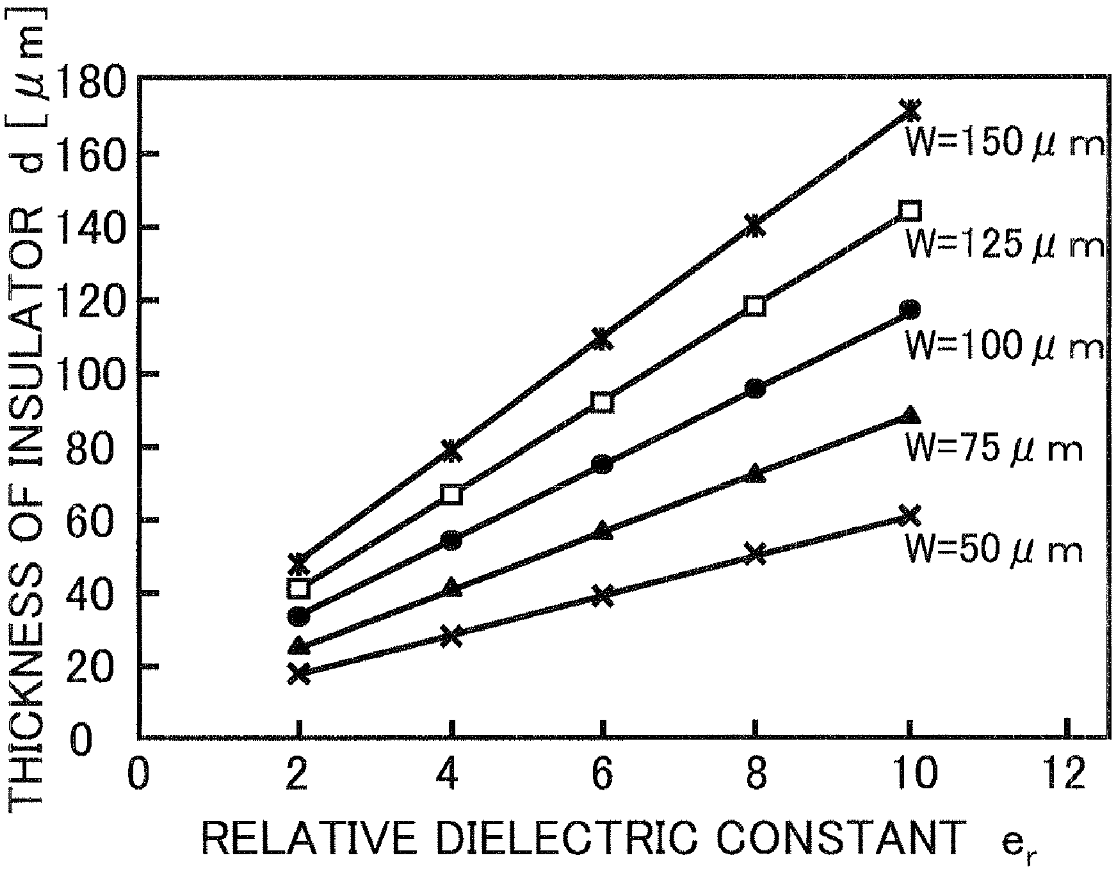
FIG. 3 illustrates a graph showing a relationship of a thickness (μm) versus a dielectric constant of insulator for each a width of a microstrip, where an impedance of the microstrip line disposed on the insulator is 50 ohms.

FIG. 3 shows the calculated thickness of the insulator for realizing the characteristic impedance 50 ohms of the microstripline, which is the transmission line formed on the surface of substrate, as parameters of the dielectric constant $e_r$ of the insulator and the line width W. FIG. 3 shows a calculated result by changing the metal width every 25 μm in a range 50 to 150 μm and the dielectric constant $e_r$ of the insulator every 2 in a range 2 to 10 on the assumption that the substrate of the high-frequency filter or the duplexer is actually manufactured.

As will be understood with reference to FIG. 3, within the calculated range, the thickness of the insulation layer for realizing 50 ohms is linearly approximated for all metal widths upon changing the dielectric constant $e_r$.

Further, an approximation equation is as follows, upon linearly approximating the change in thickness d of the insulation layer for realizing 50 ohms for the dielectric constant $e_r$ every metal width. Reference numerals $d_{50}$, $d_{75}$, $d_{100}$, $d_{125}$, and $d_{150}$ denote the thickness of the insulation layer when the metal width is 50 μm, 75 μm, 100 μm, 125 μm, and 150 μm, respectively.

$$d_{50}=5.40\times e_r+6.80 \quad \text{(Equation 3)}$$

$$d_{75}=7.75\times e_r+10.10 \quad \text{(Equation 4)}$$

$$d_{100}=10.05\times e_r+13.50 \quad \text{(Equation 5)}$$

$$d_{125}=12.45\times e_r+16.30 \quad \text{(Equation 6)}$$

$$d_{150}=14.95\times e_r+18.30 \quad \text{(Equation 7)}$$

That is, the thickness d of the insulation layer for realizing 50 ohms is expressed by the following equation.

$$d=a(W)\times e_r+b(W) \quad \text{(Equation 8)}$$

Figure 4:
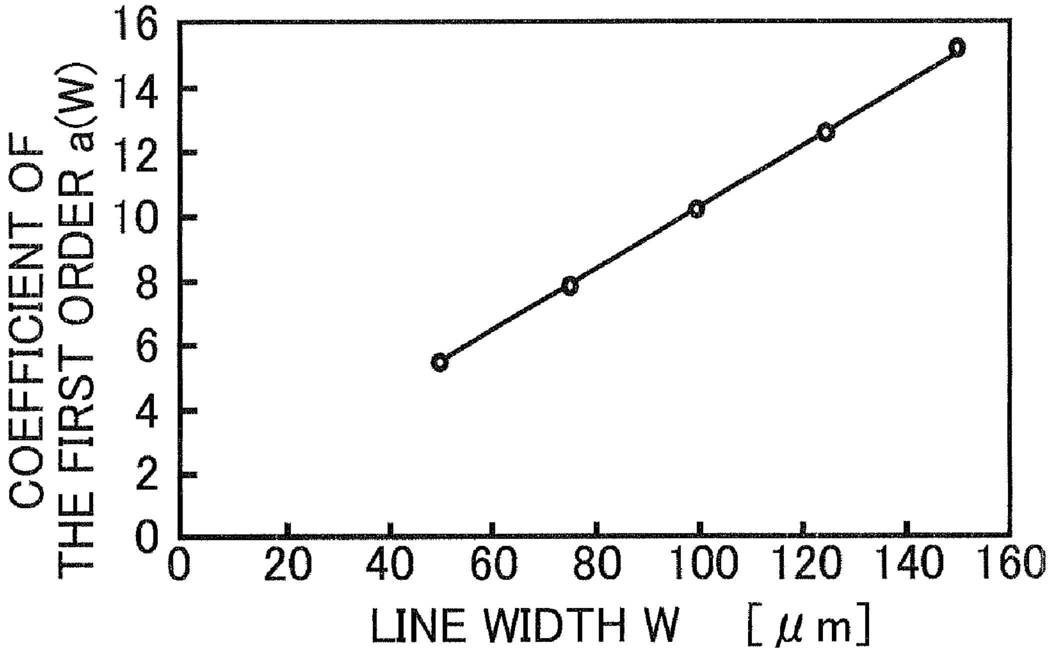
FIG. 4 illustrates a relationship between a coefficient of the first order and the line width.
Figure 5:
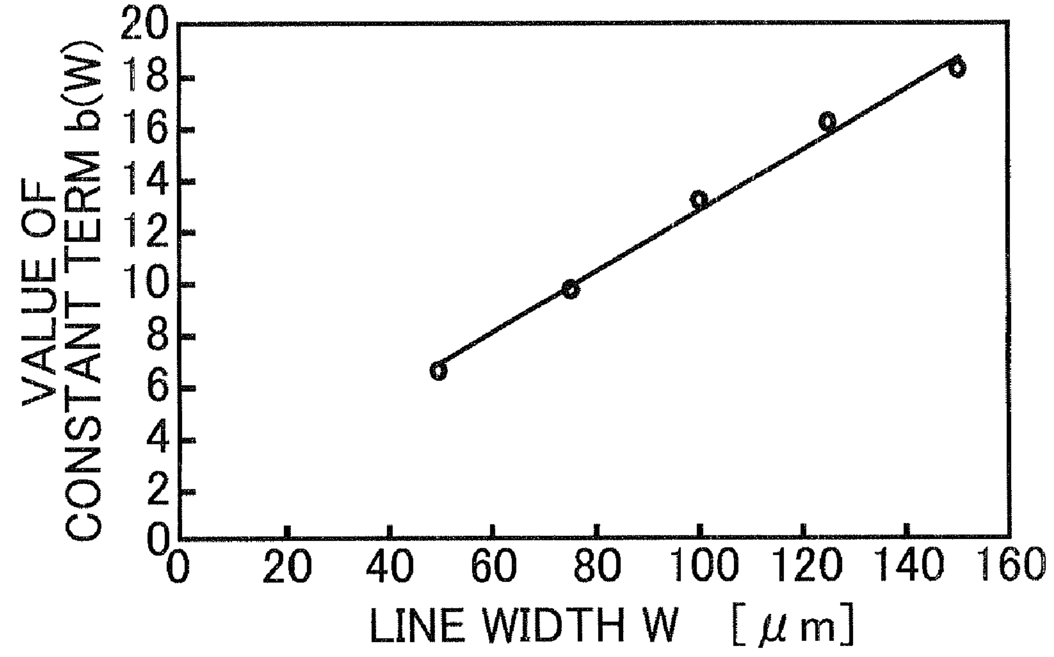
FIG. 5 illustrates a relationship between a value of constant term and the line width.

Further, the changes in first order coefficient a(W) and constant term b(W) for the metal width W in μm in equation 8 are shown in FIGS. 4 and 5. Obviously, the changes in first order coefficient and constant term for the metal width W are linearly approximated. Then, an approximation equation is as follows, upon linearly approximately the changes in FIGS. 5 and 6.

$$\text{First order coefficient } a(W)=0.0952\times W+0.6 \quad \text{(Equation 9)}$$

$$\text{Constant term } b(W)=0.1168\times W+1.32 \quad \text{(Equation 10)}$$

As a consequence, equations 9 and 10 are substituted into equation 8. Then, the insulator thickness d for obtaining 50 ohms is expressed by the following equation, upon determining the metal width W and the dielectric constant $e_r$ of the insulator, i.e., the insulator thickness d is easily and uniquely obtained.

$$d \leqq (0.0952\times W+0.6)\times e_r+(0.1168\times W+1.32) \quad \text{(Expression 11)}$$

(First Embodiment)

Figure 6:
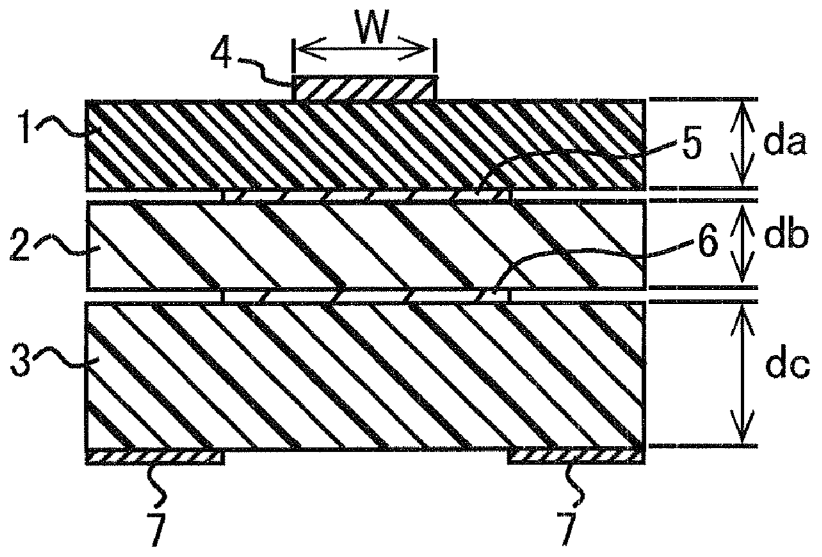
FIG. 6 illustrates a sectional view of a substrate according to the first embodiment.

FIG. 6 shows the layer structure of the substrate according to the first embodiment. A description is omitted of the layer structure because of being similar to the structure shown in FIG. 1. Insulation layers 1 to 3 comprise ceramics containing alumina as a main component, and the dielectric constant $e_r$ thereof is 9.5. The metal width W of the first metal layer 4 is 100 μm. Further, a thickness da of the first insulation layer 1 is 50 μm, a thickness db of the second insulation layer 2 is 50 μm, and a thickness dc of the third insulation layer 3 is 90 μm.

First of all, with Equation 11, a thickness d of an insulation layer for obtaining 50 ohms is obtained when $e_r$=9.5 and W=100. Then, d=109.14 μm is obtained. As a consequence, the thickness da of the first insulation layer 1 as 50 μm is thinner than ½ of the thickness of insulator for obtaining 50 ohms according to the first embodiment. Therefore, the ground pattern is arranged under the first insulation layer 1, thereby easily obtaining a characteristic impedance smaller than 50 ohms.

Figure 7:
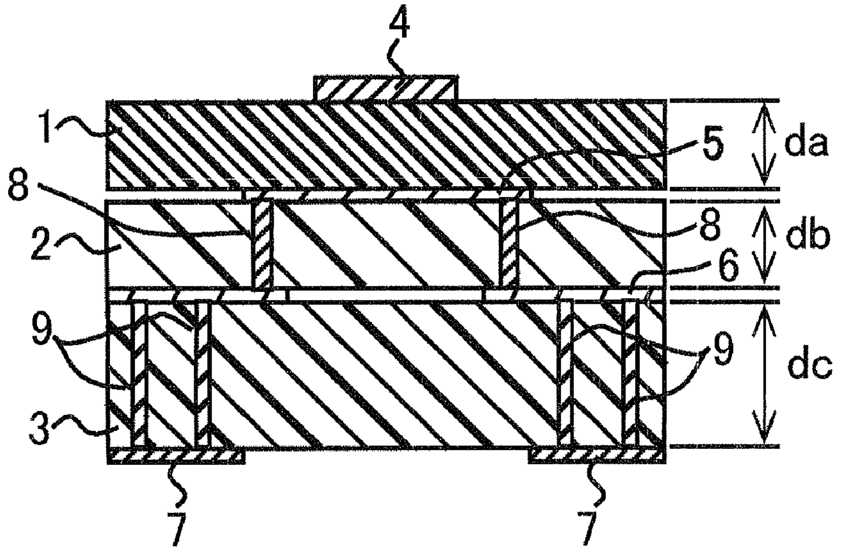
FIG. 7 illustrates a sectional view of a substrate according to the first embodiment.

Referring to FIG. 7, by arranging the ground pattern below the first insulation layer 1 (at the second metal layer 5), the characteristic impedance of 32.5 ohms is obtained. Incidentally, in the structure shown in FIG. 7, the second metal layer 5 includes the ground pattern. Therefore, via-patterns 8 and 9 electrically connected to the ground pattern of the second metal layer 5 are arranged to the second insulation layer 2 and the third insulation layer 3. Ends of the via-patterns 8 and 9 are electrically connected to the fourth metal layer 7 as a foot pattern of the substrate and are thus grounded.

Figure 8:
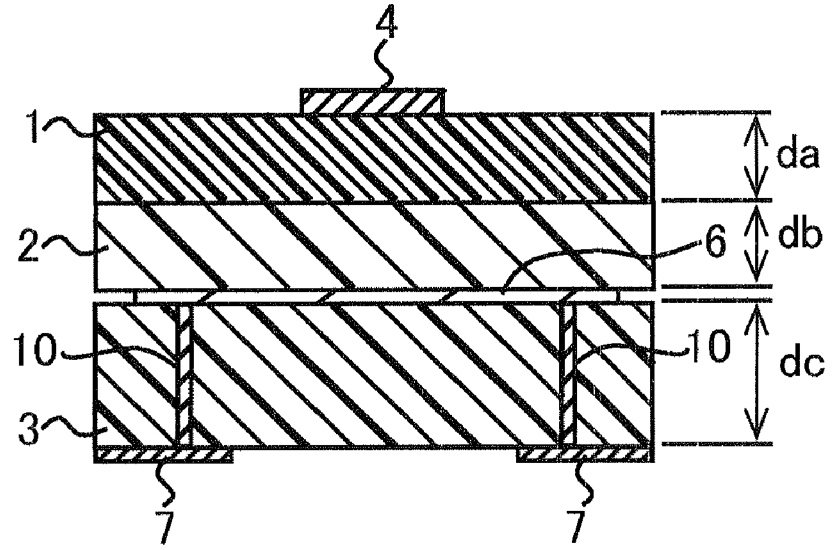
FIG. 8 illustrates a sectional view of a substrate according to the first embodiment.

Further, the thickness of the first insulation layer 1 is smaller than or equal to the half of the thickness which realizes the characteristic impedance of 50 ohms. Referring to FIG. 8, the ground pattern is arranged below the second insulation layer 2 (at the third metal layer 6), thereby obtaining 47.8 ohms. Thus, a characteristic impedance extremely close to 50 ohms can be realized without changing the metal width. Incidentally, in the structure shown in FIG. 8, the third metal layer 6 has the ground pattern. Therefore, a via-pattern 10 electrically connected to the ground pattern of the third metal layer 6 is arranged to the third insulation layer 3. An end of the via-pattern 10 is electrically connected to the fourth metal layer 7 as a foot pattern of the substrate and is thus grounded.

Figure 9:
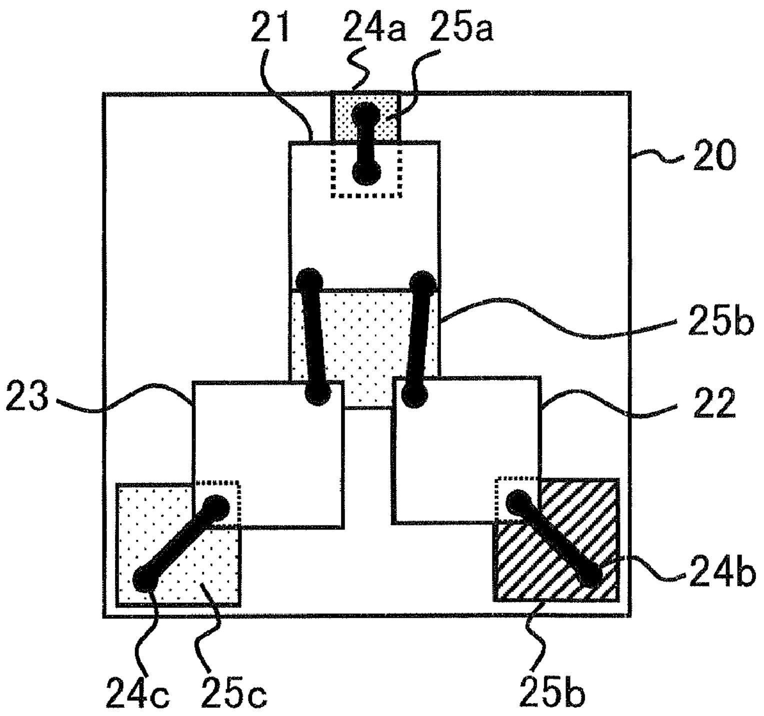
FIG. 9 illustrates a schematic diagram showing a matching circuit and filters disposed on a substrate according to the first embodiment.

FIG. 9 shows an example for structuring a duplexer by providing the filter for the substrate having the layer structure shown in FIG. 6. The duplexer shown in FIG. 9 is structured by providing a matching circuit 21, a receiving SAW filter 22, and a transmitting SAW filter 23 for the substrate 20. An antenna port 24*a*, a receiving port 24*b*, and a transmitting port 24*c* are metals formed to the first metal layer 4. Further, the width W (refer to FIG. 6) on the first metal layer 4 is 100 μm. The transmitting port 24*c* is structured as to oppose to a ground pattern 25*c* formed on the second metal layer 5 existing underbeneath, thereby setting the input impedance to be 32.5 ohms, which smaller than 50 ohms. Furthermore, underneath the antenna port 24*a* and the receiving port 24*b*, ground patterns 25*a* and 25*b* are formed to the third metal layer 6, thereby accomplishing an input impedance close to 50 ohms. In addition, a ground pattern 25*d* is formed to the second metal layer 5.

Figure 10:
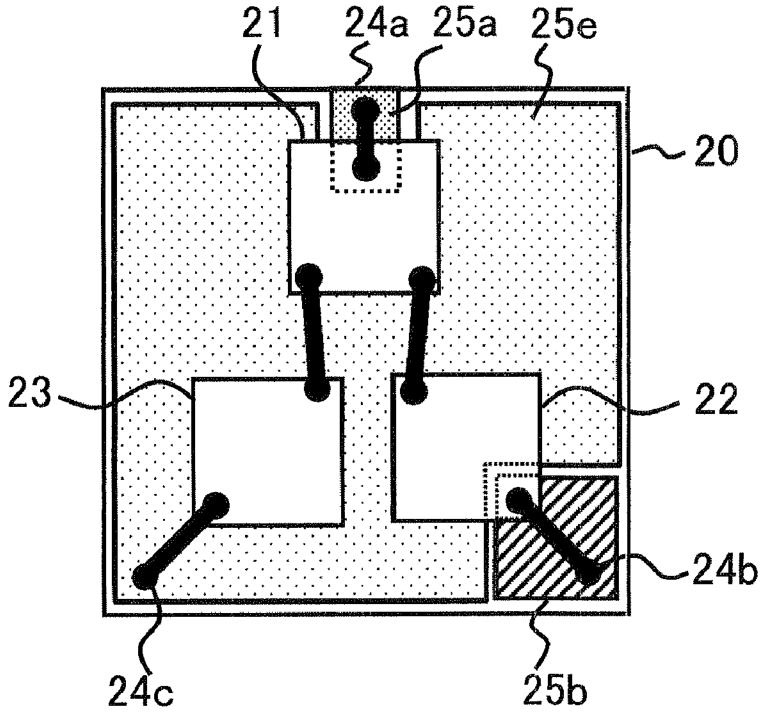
FIG. 10 illustrates a schematic diagram showing a matching circuit and filters disposed on a substrate according to the first embodiment.

Incidentally, in the structure shown in FIG. 9, the ground patterns are arranged only near underneath the metals. Referring to FIG. 10, a ground pattern 25*e* is arranged to a large part of the second metal layer 5, only an antenna port 24*a* and a receiving port 24*b* of which impedances close to 50 ohms is desired may be connected to other ground patterns 25*a* and 25*b* which are provided to the third metal layer 6.

Further, upon manufacturing an impedance larger than 50 ohms to the receiving port 24*b*, a ground pattern formed near the underneath of a metal of the receiving port may be formed to the fourth metal layer 7. Alternatively, the ground pattern may not be formed in the substrate.

(Second Embodiment)

Figure 11:
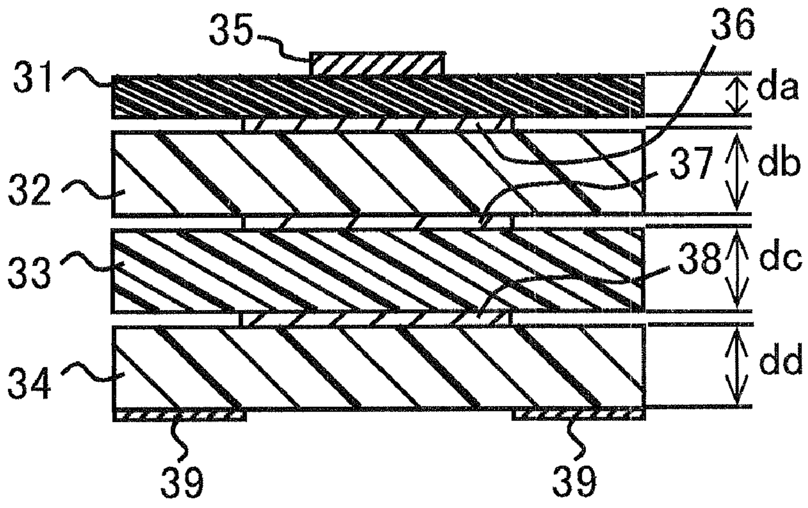
FIG. 11 illustrates a sectional view of a substrate according to the second embodiment.

FIG. 11 shows the structure of a substrate according to the second embodiment. Materials of insulation layers 31 to 34 are ceramics (Low Temperature Co-fired Ceramics), and a dielectric constant $e_r$ thereof is 7. A metal width W disposed to the first metal layer 35 is 100 μm. Further, the structure is obtained by laminating four insulation layers. A thickness da of the first insulation layer 31 is 25 μm, a thickness db of the second insulation layer 32 is 70 μm, a thickness dc of the third insulation layer 33 is 70 μm, and a thickness dd of the fourth insulation layer 34 is 70 μm.

First of all, with expression 11, the thickness d of an insulation layer of the characteristic impedance of 50 ohms is obtained when $e_r$=7 and W=100. Then, d=83.84 μm is obtained. As a consequence, the thickness da of the first insulation layer 31 according to the second embodiment is 25 μm and is thus thinner than the thickness d of an insulation layer for obtaining the characteristic impedance of 50 ohms. By arranging the ground pattern below the first insulation layer 31 (second metal layer 36), a low characteristic impedance is easily obtained.

Figure 12:
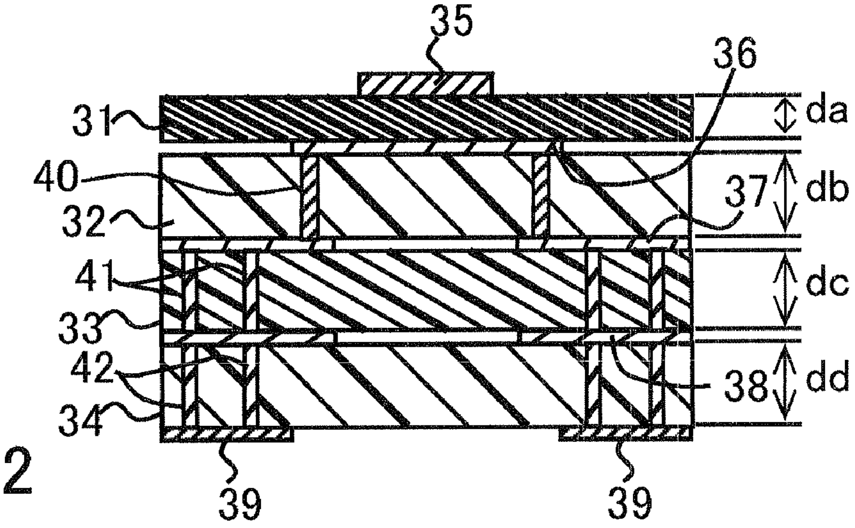
FIG. 12 illustrates a sectional view of a substrate according to the second embodiment.

Referring to FIG. 12, the ground pattern is arranged below the first insulation layer 31 (at the second metal layer 36), and the characteristic impedance of 23.4 ohms is thus obtained. In this case, a via-pattern 40 electrically connected to the second metal layer 36 is inserted into the second insulation layer 32 and is electrically connected to the ground pattern of a third metal layer 37. Further, the ground pattern of the third metal layer 37 is electrically connected to a ground pattern of a fourth metal layer 38 by a via-pattern 41 arranged to the third insulation layer 33. Further, a ground pattern of a fourth metal layer 38 is electrically connected to a fifth metal layer 39 as a foot pattern by a via-pattern 42 arranged to the fourth insulation layer 34 and is then grounded.

Figure 13:
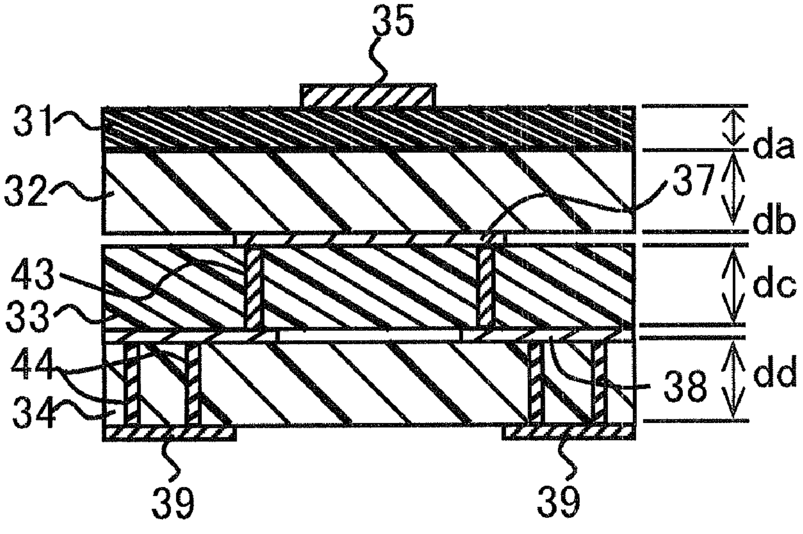
FIG. 13 illustrates a sectional view of a substrate according to the second embodiment.

Referring to FIG. 13, the ground pattern is arranged below the second insulation layer 32 (at the third metal layer 33), and the characteristic impedance of 53.7 ohms is thus obtained, thereby realizing the characteristic impedance extremely close to 50 ohms without changing the metal width. In this case, via-patterns 43 electrically connected to the third metal layer 37 are inserted into the third insulation layer 33 and electrically connected to the ground pattern disposed to the fourth metal layer 38. Further, the ground pattern of the fourth metal layer 38 is electrically connected to the fifth metal layer 39 as a foot pattern by via-patterns 44 formed to the fourth insulation layer 34 and is then grounded.

As mentioned above, the metal width does not need to be changed and the substrate can be therefore manufactured with high productivity. Further, the thickness of the undermost insulation layer is 70 μm, i.e., thicker than the first insulation layer. Therefore, the substrate can be stably manufactured with low misalignment in the manufacturing time.

Figure 14:
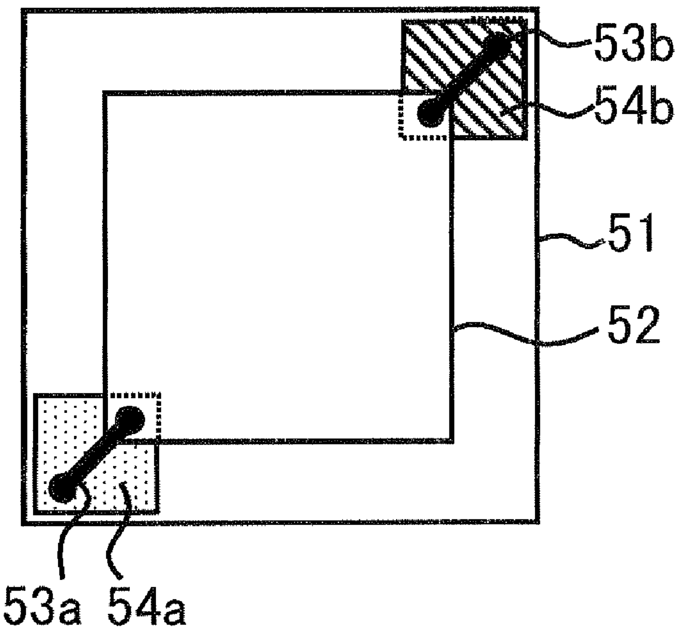
FIG. 14 illustrates a schematic diagram showing a filter disposed on a substrate according to the first embodiment.
Figure 15:
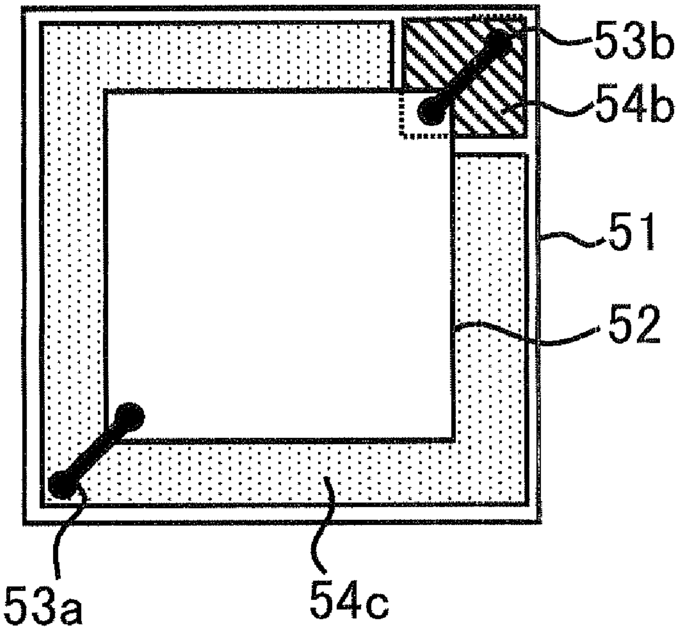
FIG. 15 illustrates a schematic diagram showing a filter disposed on a substrate according to the first embodiment.

FIG. 14 shows an example of forming a high-frequency filter by providing the filter element with the substrate having the layer structure shown in FIG. 11. The high-frequency filter shown in FIG. 14 is structured by providing an FBAR filter 52 on a substrate 51. An input port 53*a* and an output port 53*b* are formed to be wired to the first metal layer 35. The metal width disposed to the first metal layer 35 (refer to FIG. 11) is 100 μm. A ground pattern 54*a* is formed to the lower second metal layer 36, thereby setting an input impedance of the input port 53*a* to 23.4 ohms, which smaller than 50 ohms. A ground pattern 54*b* is formed to the third metal layer 37, thereby accomplishing an input impedance of the output port 53*b* of 53.7 ohms close to 50 ohms.

Incidentally, referring to FIG. 13, ground patterns are arranged only near the underneath of the metals. Alternatively, referring to FIG. 14, the ground pattern 54*c* may be arranged to a large part of the second metal layer 36. With this structure, another ground pattern 54*b* may be formed for only to the output port 53*b* of which an impedance close to 50 ohms is desired.

Further, insulation layers shown in Table 1 can be properly used.

TABLE 1

| CERAMICS | DIELECTRIC CONSTANT |
|---|---|
| A | 7 |
| B | 27 |

TABLE 1-continued

| CERAMICS | DIELECTRIC CONSTANT |
|---|---|
| C | 81 |
| D | 125 |
| E | 7.8 |
| F | 9 |

According to the first and second embodiments, the material containing ceramics as a main component is used as that of the substrate. Also with a printed-circuit board using a printed-circuit board material such as glass epoxy, polyimide, or fluorine resin, the same advantage is obtained. Alternatively, a flexible substrate may be used.

Further, according to the first and second embodiments, when using a material containing ceramics as a main component as the material of the substrate, the strength of the substrate is high. When the substrate is formed as a cavity structure, and a metallic cap is attached to the substrate by soldering joint, thereby accomplishing the air sealing. Therefore, with the structure, a preferable characteristics and high reliability may be accomplished as the substrate of the high-frequency filter or the duplexer.

Further, as a form of the transmission line formed to the surface of the substrate, the microstripline is used for explanation of the embodiments. Alternatively, a coplanar line or the like can be used, thereby obtaining the same advantage. Further, when the transmission line is structured by a coplanar line and the ground pattern is formed onto the substrate surface, if the distance between the metal and the ground is longer than the thickness of the first insulation layer, the ground arranged to a second conductive layer determines the characteristic impedance. Thus, the relationship shown by equations 1 and 2 can be used for the coplanar line.

[2. Structure of Communication Module]

Figure 16:
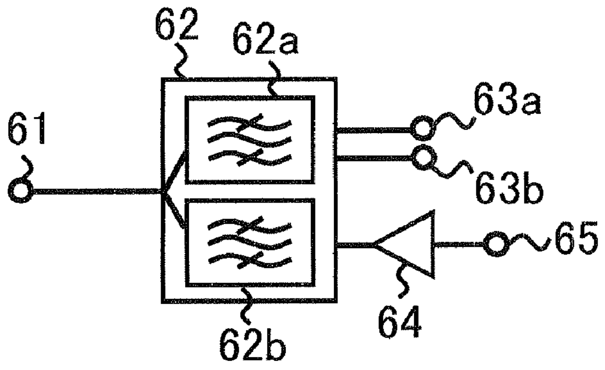
FIG. 16 illustrates a schematic block diagram showing a transmission module including a substrate, filters or a duplexer.

FIG. 16 shows an example of a communication module having the substrate, the filter, or the duplexer according to the embodiments. Referring to FIG. 16, a duplexer 62 comprises: a receiving filter 62*a*; and a transmitting filter 62*b*. Further, receiving terminals 63*a* and 63*b* corresponding to a balance output are connected to the receiving filter 62*a*. Furthermore, the transmitting filter 62*b* is connected to a transmitting terminal 65 via a power amplifier 64. Herein, the substrate, the filter, or the duplexer according to the embodiments is included in the receiving and the transmitting filters 62*a*, 62*b*.

In the receiving operation, only signals within a predetermined frequency band pass through the receiving filter 62*a* from among receiving signals inputted via an antenna terminal 61. The resultant signals are outputted to the outside from the receiving terminals 63*a* and 63*b*. Further, in the transmitting operation, only signals within a predetermined frequency band pass through the transmitting filter 62*b* from among transmitting signals inputted from the transmitting terminal 65 and amplified by the power amplifier 64. The signals are then outputted to the outside form the antenna terminal 61.

As mentioned above, the substrate, filter, or duplexer according to the embodiments is provided for the receiving filter 62*a* and the transmitting filter 62*b* in the communication module, thereby realizing a communication module with low costs and stable quality. Further, since the first insulation layer or the outermost insulation layer of the substrate is made thinner, the communication module can be thin. Furthermore, the matching circuit can be simplified and the size of the communication module can be reduced.

Incidentally, the structure of the communication module shown in FIG. 16 is an example and the substrate, filter, or duplexer according to the embodiments can be provided to another communication module, thereby obtaining the same advantage.

[3. Structure of Communication Apparatus]

Figure 17:
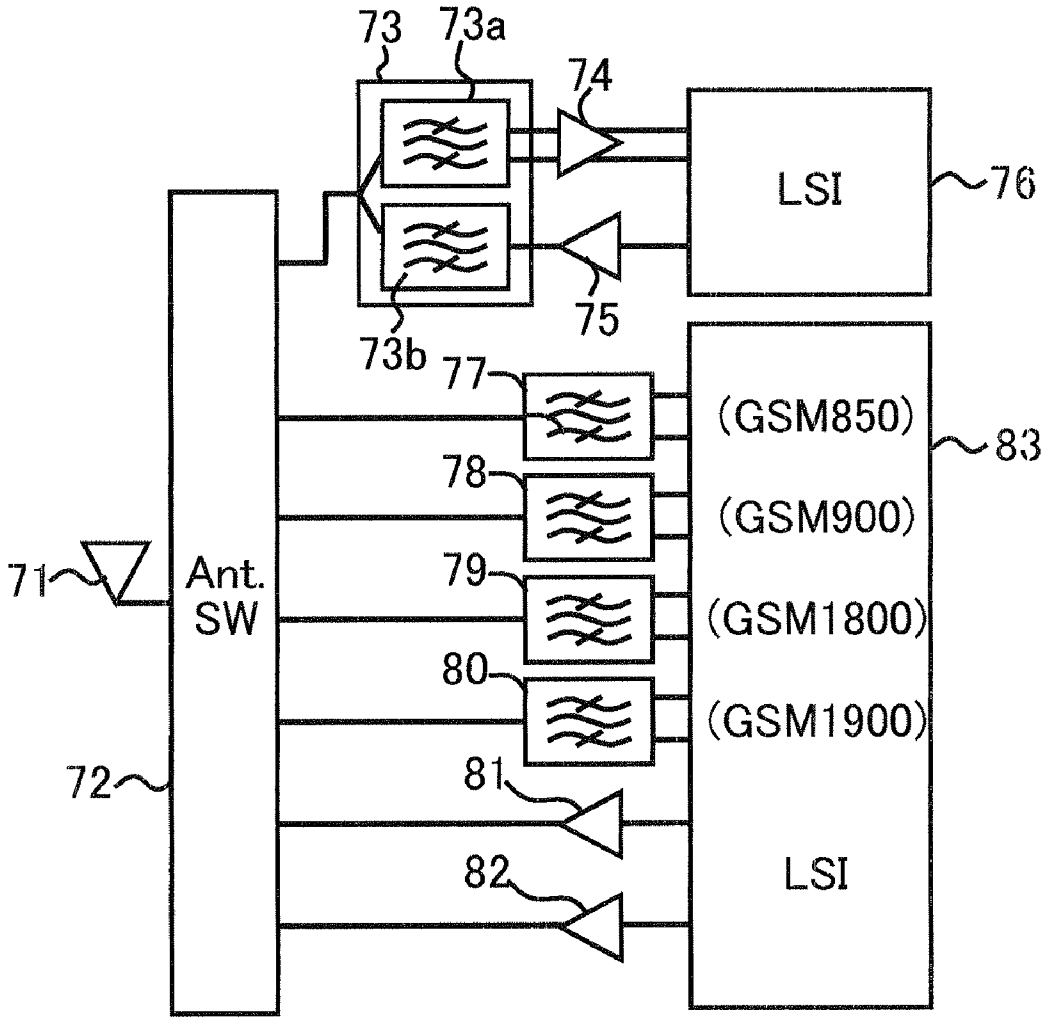
FIG. 17 illustrates a schematic block diagram showing a transmission apparatus including a transmission module according to an embodiment.
Figure 18A:
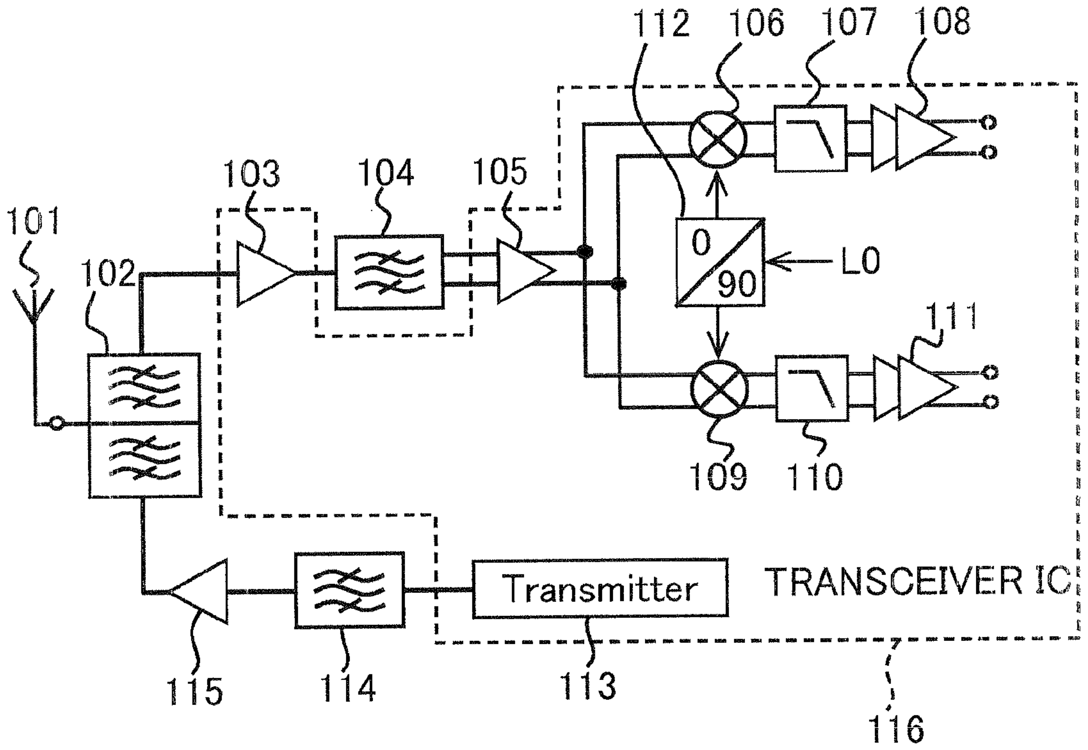
Fig. 18A (RELATED ART)
FIG. 18A illustrates a block diagram showing a conventional RF block and FIG. 18B illustrates a configuration of a power amplifier included in the block diagram shown in FIG. 18A.
Figure 18B:
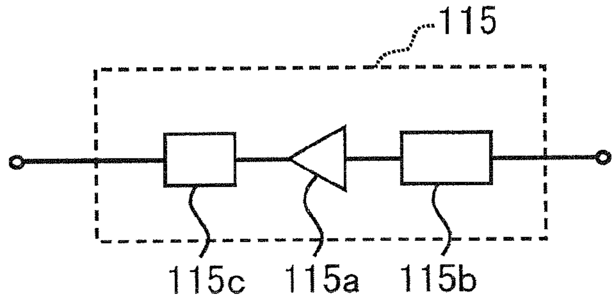
Fig.18B (RELATED ART)
Figure 19:
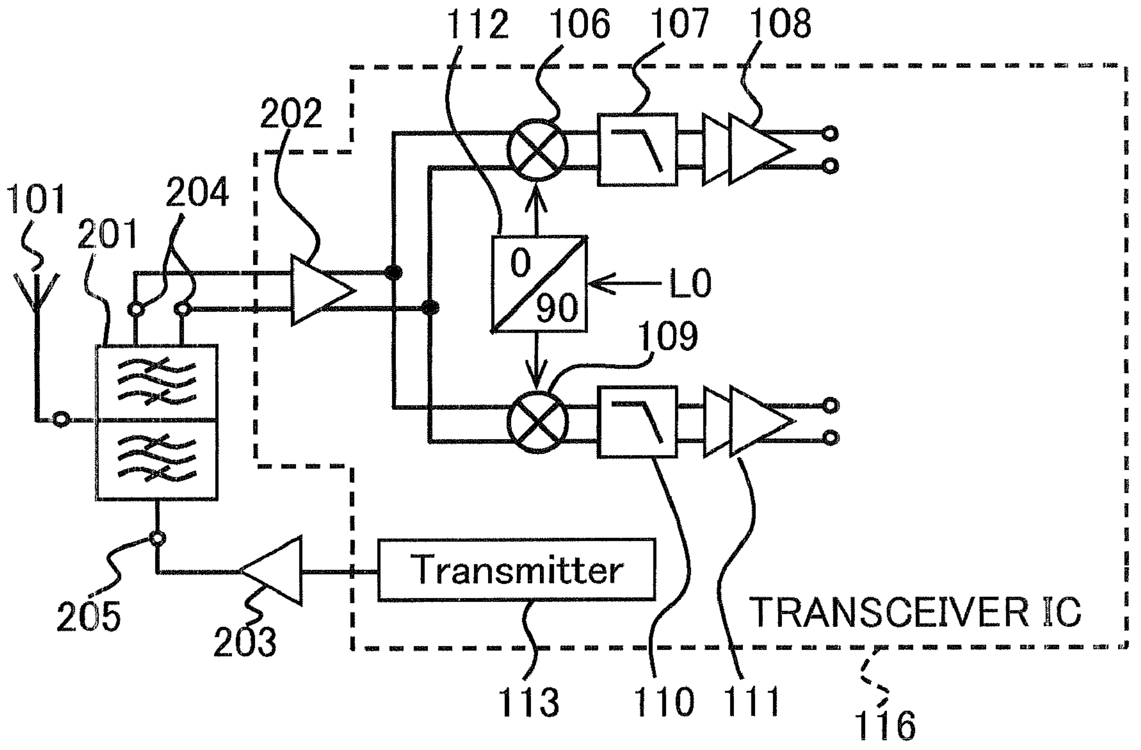
FIG. 19 illustrates a block diagram of a conventional RF block.

FIG. 17 shows an RF block of a mobile phone, as an example of a communication apparatus having the communication module according to the embodiments. Further, the structure shown in FIG. 17 is that of a mobile phone corresponding to a Global System for Mobile Communications (GSM) communication system and a Wide band Code Division Multiple Access (W-CDMA) communication system. Furthermore, the GSM communication system according to the embodiment corresponds to 850 MHz band, 950 MHz band, 1.8 GHz band, and 1.9 GHz band. Moreover, the mobile phone comprises a microphone, a speaker, and a liquid crystal display, and the like, in addition to the structure shown in FIG. 17. Since a description thereof is not necessary according to the embodiment, the drawings are omitted. Herein, receiving filters 73*a*, 77, 78, 79, and 80, and a transmitting filter 73*b* include the substrate, filter, or duplexer according to the embodiments.

First of all, depending on as whether the communication system of a receiving signal inputted via an antenna 71 is W-CDMA or GSM, an antenna switch circuit 72 selects an LSI or LSIs designated for the communication system. When the inputted receiving signal corresponds to the W-CDMA communication system, the receiving signal is switched to be outputted to a duplexer 73. The receiving signal inputted to the duplexer 73 is limited to a predetermined frequency band by the receiving filter 73*a*, and a balance-type receiving signal is outputted to a low noise amplifier (LNA) 74. The LNA 74 amplifies the receiving signal and then outputs the amplified signal to an LSI 76. The LSI 76 performs demodulating processing to an audio signal on the basis of the receiving signal to be inputted and controls the operations of units in the mobile phone.

Upon transmitting a signal, the LSI 76 generates a transmitting signal. The generated transmitting signal is amplified by the power amplifier 75 and is inputted to the transmitting filter 73*b*. Only signals within a predetermined band pass through the transmitting filter 73*b* from among the transmitting signals to be inputted. The transmitting signal outputted from the transmitting filter 73*b* is outputted to the outside from the antenna 71 via the antenna switch circuit 72.

Further, when the receiving signal to be inputted corresponds to the GSM communication system, the antenna switch circuit 72 selects one of receiving filters 77 to 80 in accordance with the frequency band, and outputs the receiving signal to the selected receiving filter. The receiving signal whose band is limited by one of the receiving filters 77 to 80 is inputted to an LSI 83. The LSI 83 perloms demodulating processing to the audio signal on the basis of the receiving signal to be inputted and controls the operation of the units in the mobile phone. When transmitting a signal, the LSI 83 generates the transmitting signal. The generated transmitting signal is amplified by a power amplifier 81 or 82, and is outputted to the outside via the antenna switching circuit 72 from the antenna 71.

As mentioned above, the communication module having the substrate, filter, or duplexer according to the embodiments is provided for the communication apparatus, thereby realizing the communication apparatus with low costs and stable quality. Further, the communication apparatus is made thin so as to make the first insulation layer of the substrate thin.

According to the embodiments, with respect to the impedance necessary for structuring the high-frequency filter or duplexer having a plurality of input impedances, it is possible to stably provide a substrate that can be stably manufactured with low costs and an extremely high degree of freedom for design. Consequently, it is possible to provide a high-frequency filter and a duplexer with low costs and stable quality.

Further, the entire substrate is made thinner because of making the first insulation layer (the first insulation layer 1 according to the embodiments) of the substrate thinner. The high-frequency filter and the duplexer having the substrate are made thin.

Furthermore, the substrate, filter, or duplexer according to the present invention is provided for the communication module or communication apparatus, thereby reducing the size of the communication module or communication apparatus or making the communication module or communication apparatus thinner.

What is claimed is:

1. A substrate for mounting one or more filters comprising:
a first insulation layer; and
a second insulation layer which has a thickness that is greater than the thickness of the first insulation layer, the second insulation layer being placed below and laminated to a the first insulation layer,
wherein the substrate has a first region and a second region, wherein the first region of the substrate further comprises:
a first connection line layer on the first insulating layer, the first connection line layer having at least one transmission line for connecting the filter; and
a ground layer interposed between the first insulation layer and the second insulation layer, the first insulation layer having a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and
wherein the second region of the substrate further comprises:
a second connection line layer on the first insulating layer, the second connection line layer having at least one transmission line; and
a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

2. The substrate according to claim 1, wherein the thickness of the first insulation layer satisfies a relationship $d<(0.0952\times W+0.6)\times e_r+(0.1168\times W+1.32)$, where d is the thickness of the first insulation layer, W is the width of the transmission line of the first connection line layer, and $e_r$ is the dielectric constant of the first insulation layer.

3. The substrate according to claim 1, further comprising two or more insulation layers.

4. The substrate according to claim 1, wherein the first insulation layer includes ceramics.

5. The substrate according to claim 1, further comprising one or more insulation layers, wherein a bottom layer thereof has a thickness thicker than the first insulation layer.

6. The substrate according to claim 1, further comprising a third insulation layer interposed between said first insulation layer and the second insulation layer.

7. A substrate for mounting one or more filters comprising:
a first insulation layer; and
a second insulation layer which has a thickness that is greater than the thickness of the first insulation layer, the second insulation layer being placed below the first insulation layer,
wherein the substrate has a first region and a second region, wherein the first region of the substrate further comprises:
a first connection line layer on the first insulating layer, the first connection line layer having at least one transmission line for connecting the filter; and
a ground layer interposed between the first insulation layer and the second insulation layer, the first insulating layer having half a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and
wherein the second region of the substrate further comprises:
a second connection line layer on the first insulating layer, the second connection line layer having at least one transmission line; and
a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

8. The substrate according to claim 7, wherein the thickness of the first insulation layer satisfies a relationship
$d\leqq((0.0952\times W+0.6)\times e_r+(0.1168\times W+1.32))/2$, where d is the thickness of the first insulation layer, W is the width of the transmission line of the first connection line layer, and $e_r$ is the dielectric constant of the first insulation layer.

9. The substrate according to claim 7, further comprising two or more insulation layers.

10. The substrate according to claim 7, wherein the first insulation layer includes ceramics.

11. The substrate according to claim 7, further comprising one or more insulation layers, wherein a bottom layer thereof has a thickness thicker than the first insulation layer.

12. The substrate according to claim 7, further comprising a third insulation layer interposed between said first insulation layer and the second insulation layer.

13. A filter comprising:
a substrate including:
a first insulation layer; and
a second insulation layer which has a thickness that is greater than the thickness of the first insulation layer, the second insulation layer being placed below the first insulation layer,
wherein the substrate has a first region and a second region, wherein the first region of the substrate further comprises:
a first connection line layer on the first insulating layer, the first connection line layer including a transmission line for connecting a filter; and
a ground layer interposed between the first insulation layer and the second insulation layer, the first insulation layer having a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and wherein the second region of the substrate further comprises:

a second connection line layer on the first insulating layer, the second connection line layer including a transmission line; and a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

14. The filter according to claim 13, further comprising a third insulation layer interposed between said first insulation layer and the second insulation layer.

15. A filter comprising:

a substrate including:

a first insulation layer; and a second insulation layer which has a thickness that is greater than the thickness of the first insulation layer, the second insulation layer being placed below the first insulation layer, wherein the substrate has a first region and a second region, wherein the first region of the substrate further comprises:

a first connection line layer on the first insulating layer, the first connection line layer including a transmission line for connecting a filter; and a ground layer interposed between the first insulation layer and the second insulation layer, the first insulating layer having half a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and wherein the second region of the substrate further comprises:

a second connection line layer on the first insulating layer, the second connection line layer including a transmission line; and a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

16. The filter according to claim 15, further comprising a third insulation layer interposed between said first insulation layer and the second insulation layer.

17. A duplexer comprising:

a filter including:

a substrate including:

a first insulation layer; and a second insulation layer which has a thickness that is greater than the thickness of the first insulation layer, the second insulation layer being placed below the first insulation layer, wherein the substrate has a first region and a second region, wherein the first region of the substrate further comprises:

a first connection line layer on the first insulating layer, the first connection line layer including a transmission line for connecting a filter; and a ground layer interposed between the first insulation layer and the second insulation layer, the first insulation layer having a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and wherein the second region of the substrate further comprises:

a second connection line layer on the first insulating layer, the second connection line layer including a transmission line; and a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

18. The duplexer according to claim 17, further comprising a third insulation layer interposed between said first insulation layer and the second insulation layer.

19. A duplexer comprising:

a filter including:

a substrate including:

a first insulation layer; and a second insulation layer which has a thickness that is greater than the thickness of the first insulation layer, the second insulation layer being placed below the first insulation layer, wherein the substrate has a first region and a second region, wherein the first region of the substrate further comprises:

a first connection line layer on the first insulating layer, the first connection line layer including a transmission line for connecting a filter; and a ground layer interposed between the first insulation layer and the second insulation layer, the first insulating layer having half a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and wherein the second region of the substrate further comprises:

a second connection line layer on the first insulating layer, the second connection line layer including a transmission line; and a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

20. The duplexer according to claim 19, further comprising a third insulation layer interposed between said first insulation layer and the second insulation layer.

21. A communication module comprising:

a duplexer having:

a filter including:

a substrate including:

a first insulation layer; and a second insulation layer which has a thickness that is greater than the thickness of the first insulation layer, the second insulation layer being placed below the first insulation layer, wherein the substrate has a first region and a second region, wherein the first region of the substrate further comprises:

a first connection line layer on the first insulating layer, the first connection line layer including a transmission line for connecting a filter; and a ground layer interposed between the first insulation layer and the second insulation layer, the first insulation layer having a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and wherein the second region of the substrate further comprises:

a second connection line layer on the first insulating layer, the second connection line layer including a transmission line; and a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

22. The communication module according to claim 21, further comprising a third insulation layer interposed between said first insulation layer and the second insulation layer.

23. A transmission apparatus comprising:

a communication module having:

a duplexer having:

a filter including:

a substrate including:

a first insulation layer; and a second insulation layer which has a thickness that is greater than the thickness of the first insulation layer, the second insulation layer being placed below the first insulation layer, wherein the substrate has a first region and a second region, wherein the first region of the substrate further comprises:

a first connection line layer on the first insulating layer, the first connection line layer including a transmission line for connecting a filter; and a ground layer interposed between the first insulation layer and the second insulation layer, the first insulation layer having a thickness which satisfies a characteristic impedance of the transmission line of the first connection line layer in a range 0.1 to 50 ohms, the characteristic impedance being determined by the thickness and a dielectric constant of the first insulation layer and a width of the transmission line of the first connection line layer, and wherein the second region of the substrate further comprises:

a second connection line layer on the first insulating layer, the second connection line layer including a transmission line; and a ground layer disposed below the second insulation layer, defining a characteristic impedance of said transmission line of the second connection line layer that is different from the characteristic impedance of the transmission line of the first connection line layer, said ground layer being absent between the first insulation layer and the second insulation layer.

24. The transmission apparatus according to claim 23, further comprising a third insulation layer interposed between said first insulation layer and the second insulation layer.

25. A substrate for mounting one or more filters comprising:

a first insulation layer;

a second insulation layer below the first insulation layer; and a third insulation layer below the second insulation layer, wherein the substrate has a first region and a second region, wherein the first region of the substrate further comprises:

a first transmission line on the first insulation layer; and an electrode layer connected to a ground potential, interposed between the first insulation layer and the second insulation layer, defining a characteristic impedance of the first transmission line, and wherein the second region of the substrate further comprises:

a second transmission line on the first insulation layer; and an electrode layer connected to the ground potential, interposed between the second insulation layer and the third insulation layer, defining a characteristic impedance of the second transmission line that is different in value from the characteristic impedance of the first transmission line.

26. The substrate according to claim 25, wherein the first transmission line has the same width as the second transmission line.

27. The substrate according to claim 25, wherein the first insulation layer is thinner than the second insulation layer.

28. The substrate according to claim 25, wherein the characteristic impedance of the second transmission line is substantially equal to 50 ohms, and the characteristic impedance of the first transmission line is less than that of the second transmission line.

29. The substrate according to claim 25, wherein the thickness and the material of the first insulation layer and the second insulation layer are configured such that the characteristic impedance of the first transmission line equals a first prescribed impedance value and the characteristic impedance of the second transmission line equals a second prescribed impedance value.

30. The substrate according to claim 25, further comprising a filter element connected between the first region and the second region, the first transmission line in the first region functioning as an input port of the filter element and the second transmission line in the second region functioning as an output port of the filter element.

31. The substrate according to claim 25, each of the first insulation layer and the second insulation layer is made of ceramic.

* * * * *